US012635476B2

(12) United States Patent
Zhao et al.

(10) Patent No.: US 12,635,476 B2
(45) Date of Patent: May 19, 2026

(54) WAFER CLEANING EQUIPMENT, WAFER CHUCK, AND WAFER CLEANING METHOD

(71) Applicant: BEIJING NAURA MICROELECTRONICS EQUIPMENT CO., LTD., Beijing (CN)

(72) Inventors: Hongyu Zhao, Beijing (CN); Aibing Li, Beijing (CN); Ruiting Wang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 60 days.

(21) Appl. No.: 18/293,633

(22) PCT Filed: Aug. 2, 2022

(86) PCT No.: PCT/CN2022/109581
§ 371 (c)(1),
(2) Date: Jan. 30, 2024

(87) PCT Pub. No.: WO2023/011435
PCT Pub. Date: Feb. 9, 2023

(65) Prior Publication Data
US 2024/0339353 A1 Oct. 10, 2024

(30) Foreign Application Priority Data
Aug. 6, 2021 (CN) ........................ 202110900157.X

(51) Int. Cl.
*H01L 21/687* (2006.01)
*B08B 3/02* (2006.01)
(Continued)

(52) U.S. Cl.
CPC ............ *H10P 72/7612* (2026.01); *B08B 3/02* (2013.01); *H10P 72/0414* (2026.01); *B08B 5/02* (2013.01)

(58) Field of Classification Search
CPC ............... H01L 21/67051; H01L 21/68; H01L 21/68728; H01L 21/02057;
(Continued)

(56) References Cited

U.S. PATENT DOCUMENTS 6,164,894 A * 12/2000 Cheng ................ G01R 31/2887
414/416.03
6,767,170 B2 * 7/2004 Kostler ............... G03F 7/70708
414/217
(Continued)

FOREIGN PATENT DOCUMENTS

CN 104576495 A 4/2015
CN 105225995 B * 3/2018
(Continued)

OTHER PUBLICATIONS

The World Intellectual Property Organization (WIPO) International Search Report for PCT/CN2022/109581 Sep. 22, 2022 5 Pages (including translation).

*Primary Examiner* — Benjamin L Osterhout
(74) *Attorney, Agent, or Firm* — Anova Law Group, PLLC

(57) ABSTRACT

The present disclosure provides a wafer chuck in semiconductor cleaning equipment, including a chuck base, a jetting assembly arranged on the chuck base, and a plurality of wafer lifting shafts arranged on the chuck base. The chuck base includes a carrier surface for supporting the wafer. The gas outlet of the jetting assembly is located in the center area of the carrier surface and configured to jet gas between the carrier surface and the wafer. The plurality of wafer lifting shafts are distributed around the gas outlet of the jetting
(Continued)

assembly along the circumference of the carrier surface. Each wafer lifting shaft of the plurality of wafer lifting shafts is movable relative to the chuck base, and each wafer lifting shaft includes an inclined platform. The inclined platform includes an inclined extension surface. The inclined extension surface is configured to carry the wafer at the edge of the wafer.

20 Claims, 9 Drawing Sheets

(51) Int. Cl.

| | | |
|---|---|---|
| *H01L 21/67* | (2006.01) | |
| *H10P 72/00* | (2026.01) | |
| *H10P 72/76* | (2026.01) | |
| *B08B 5/02* | (2006.01) | |

(58) Field of Classification Search
CPC . H01L 21/68742; H01L 21/67; H01L 21/687; H01L 21/6838; H01L 21/683; H01L 21/02; H01L 21/68785; B08B 3/02; B08B 5/02; H01P 72/7612; H01P 72/0414
See application file for complete search history.

(56) References Cited

U.S. PATENT DOCUMENTS

| | | | | |
|---|---|---|---|---|
| 8,607,807 | B2 * | 12/2013 | Higashijima | ....... H01L 21/6708 134/102.1 |
| 12,300,515 | B2 * | 5/2025 | Park | .......................... B08B 7/04 |
| 2012/0097908 | A1 * | 4/2012 | Willwerth | ......... H01L 21/68742 254/93 R |
| 2015/0332951 | A1 * | 11/2015 | Male | ................. H01L 21/68785 361/234 |

FOREIGN PATENT DOCUMENTS

| | | | | | |
|---|---|---|---|---|---|
| CN | 212498397 | U | * | 2/2021 | |
| DE | 102014019568 | A1 | * | 7/2015 | ....... H01L 21/67109 |
| JP | H11186367 | A | | 7/1999 | |
| JP | 2005243812 | A | | 9/2005 | |
| JP | 2012156422 | A | | 8/2012 | |
| JP | 2015222754 | A | | 12/2015 | |
| KR | 20070000686 | A | * | 1/2007 | ......... H01L 21/6719 |
| KR | 20110008832 | A | | 1/2011 | |
| KR | 20140097397 | A | | 8/2014 | |
| TW | I531423 | B | | 5/2016 | |
| WO | 2017033495 | A1 | | 3/2017 | |

* cited by examiner

WAFER CLEANING EQUIPMENT, WAFER CHUCK, AND WAFER CLEANING METHOD

CROSS-REFERENCE TO RELATED APPLICATIONS

This application is a national phase entry under 35 U.S.C. § 371 of International Application No. PCT/CN2022/109581, filed on Aug. 2, 2022, which claims priority to Chinese Application No. 202110900157.X filed on Aug. 6, 2021, the entire contents of both of which are incorporated herein by reference.

TECHNICAL FIELD

The present disclosure generally relates to the semiconductor processing equipment field and, more particularly, to wafer cleaning equipment, a wafer chuck of the wafer cleaning equipment, and a wafer cleaning method.

BACKGROUND

In the semiconductor processing field, the cleanliness of a wafer surface has a critical impact on product yield. How to effectively clean a wafer and improve the cleanliness of the wafer surface have become important research topics in the field.

In existing single-wafer cleaning equipment, two solutions for lifting the wafer exist. In one solution, the wafer carried by the chuck is lifted up and down through pins. That is, the wafer carried by the chuck is lifted up by the pins passing through the chuck to fetch the wafer or the wafer is placed by the pins being retracted under the chuck. Another solution is a gas floating method. That is, gas is injected to the back side of the wafer to lift the wafer. However, the two solutions have disadvantages that are difficult to overcome and cannot satisfy higher requirements of the wafer cleaning process on the wafer lifting solution.

In some embodiments, in the pin solution, when the pins contact the wafer, the backside (i.e., wafter backside) of the wafer can be contaminated or scratched. In some processes, for example, in backside cleaning equipment, since the front side of the wafer faces downward, the chuck and the pattern at the front side of the wafer are not in physical contact. Lifting the wafer in the gas floating method can avoid physical contact with the wafer. However, the solution has a high requirement on the stability and cleanliness of the gas flow, the lifting height of the wafer is not stable, and the surface of the wafer can be contaminated by particles due to the gas cleanliness.

Therefore, how to provide a wafer lifting positioning solution to avoid contact with the pattern of the wafer and ensure the stability of the wafer height is a technical problem to be solved.

SUMMARY

The present disclosure is intended to provide wafer cleaning equipment, a wafer chuck, and a wafer cleaning method. With the wafer chuck, contact with the pattern member of the wafer can be avoided, and the accuracy of the wafer process position and the wafer fetch and place position can be improved.

To realize the above purpose, as an aspect of the present disclosure, wafer chuck in a semiconductor cleaning equipment is provided and includes a chuck base, a jetting assembly arranged at the chuck base, and a plurality of wafer lifting shafts arranged at the chuck base. The chuck base includes a carrier surface for supporting a wafer, and a gas outlet of the jetting assembly is located in a center area of the carrier surface and is used to jet gas between the carrier surface and the wafer.

The plurality of wafer lifting shafts are distributed around the gas outlet of the jetting assembly along a circumferential direction of the carrier surface, each wafer lifting shaft of the plurality of wafer lifting shafts is movable relative to the chuck base, each wafer lifting shaft includes an inclined platform, the inclined platform includes an inclined extension surface, the inclined extension surface is configured to support the wafer at an edge of the wafer and is configured to cause the wafer to move along the inclined extension surface to different height positions when the wafer lifting shaft moves relative to the chuck base.

In some embodiments, the inclined extension surface includes a first surface, a second surface, and a transition curved surface connecting between thereof. The first surface is higher than the second surface, and the second surface is higher than the carrier surface, and the transition curved surface spirally extends around an axis of the wafer lifting shaft.

Each wafer lifting shaft of the plurality of wafer lifting shafts rotates relative to the chuck base around the axis of the wafer lifting shaft in a first direction or a second direction opposite to the first direction to cause the wafer to slide to a first height position in contact with the first surface along the transition curved surface or a second height position in contact with the second surface.

In some embodiments, a top end of the wafer lifting shaft further includes a fixed pillar extending in a vertical direction. The inclined extension surface extends around the circumference of the fixed pillar. Fixed pillars of the plurality of wafer lifting shafts are configured to together limit the wafer within a position limiting space enclosed by the fixed pillars of the plurality of wafer lifting shafts.

In some embodiments, an axis of the fixed pillar is eccentrically arranged relative to the axis of the wafer lifting shaft to adjust a size of the position limiting space when each wafer lifting shaft of the plurality of wafer lifting shafts rotates in the first direction or the second direction. When the wafer is in contact with the first surface of the second surface, the fixed pillars of the plurality of wafer lifting shafts are located at a position close to clamping a side edge of the wafer.

In some embodiments, the wafer chuck further includes a drive assembly configured to drive the plurality of wafer lifting shafts to rotate synchronously.

In some embodiments, the wafer lifting shaft includes a gear segment under the carrier surface. The drive assembly includes a drive source and a gear ring coaxially arranged with the chuck base. A gear structure around an axis of the gear ring is arranged at a sidewall of the gear ring. The gear structure meshes the gear segment. The drive source is configured to drive the gear ring to rotate around the axis of the gear ring to drive the plurality of wafer lifting shafts to rotate synchronously.

In some embodiments, the wafer lifting shaft includes a lifting shaft body and a gear, a top end of the lifting shaft body includes the inclined platform, and the gear is sleeved at the lifting shaft body to form the gear segment.

In some embodiments, the carrier surface includes an installation groove. A bottom surface of the installation groove includes a first flat surface and an inner conical surface around the first flat surface. A gas guide hole coaxial with the chuck base is formed on the first flat surface.

The jetting assembly includes a jet cover. The jet cover is arranged in the installation groove. A bottom surface of the jet cover includes a second flat surface and an outer conical surface around the second flat surface. A first gap is formed between the first flat surface and the second flat surface. A second gap is formed between the outer conical surface and the inner conical surface, and the gas guide hole, the first gap, and the second gap communicate with each other.

A plurality of jetting holes penetrating from a top surface of the jet cover to the outer conical surface are formed at an edge of the jet cover, and the plurality of jetting holes are arranged at intervals along a circumferential direction of the jet cover, a gas inlet end of the jetting hole communicates with the second gap, and a gas outlet end of the jetting hole is the gas outlet of the jetting assembly.

As a second aspect of the present disclosure, wafer cleaning equipment is provided. The wafer cleaning equipment includes the wafer chuck.

In some embodiments, the wafer cleaning equipment further includes a spray assembly, and the spray assembly is configured to spray cleaning solution onto the wafer carried by the carrier surface from a position above the carrier surface.

As a third aspect of the present disclosure, a wafer cleaning method is provided. The wafer cleaning method is applied in the wafer cleaning equipment. The wafer cleaning method includes:

transferring a to-be-cleaned wafer onto the inclined extension surface to be located at a first height position of performing a wafer fetching and placing operation;

controlling the plurality of wafer lifting shafts to move relative to the chuck base to cause the wafer to slide down from the first height position along the inclined extension surface to a second height position for a wafer cleaning process;

controlling the jetting assembly to jet gas and controlling the spray assembly to spray the cleaning solution onto the wafer for the wafer cleaning process; and controlling the jetting assembly to stop jetting the gas, controlling the spray assembly to stop spraying the cleaning solution onto the wafer, and causing the plurality of wafer lifting shafts to move reversely to cause the wafer to slide up from the second height position along the inclined extension surface to the first height position.

In some embodiments, the inclined extension surface includes the first surface, the second surface, and the transition curved surface connecting between thereof. The first surface is higher than the second surface, the second surface is higher than the carrier surface, and the transition curved surface spirally extends around the axis of the wafer lifting shaft. Each wafer lifting shaft of the plurality of wafer lifting shafts rotates relative to the chuck base and around the axis of the wafer lifting shaft in the first direction or the second direction that is opposite to the first direction to cause the wafer to be able to slide to the first height position in contact with the first surface or the second height position in contact with the second surface along the transition curved surface. The top end of the wafer lifting shaft includes the fixed pillar extending in the vertical direction, the inclined extension surface extends around the circumferential direction of the fixed pillar, the fixed pillars of the plurality of wafer lifting shafts are configured to together limit the wafer in the position limiting space enclosed by the fixed pillars of the plurality of wafer lifting shafts. The axis of the fixed pillar is arranged eccentrically relative to the axis of the wafer lifting shaft to adjust the size of the position limiting space when the plurality of wafer lifting shafts rotate in the first direction or the second direction. When the wafer contacts the first surface or the second surface, the fixed pillars of the plurality of wafer lifting shafts are at a position near and clamping the side edge of the wafer.

When the wafer is at the first height position, the fixed pillars of the plurality of wafer lifting shafts are at the position near and clamping the side edge of the wafer.

When the wafer is at the second height position, the fixed pillars of the plurality of wafer lifting shafts are at the position near and clamping the side edge of the wafer.

In the wafer cleaning equipment, wafer chuck, and wafer cleaning method of the present disclosure, the plurality of wafer lifting shafts are distributed circumferentially along the carrier surface of the chuck base. Each wafer lifting shaft of the plurality of wafer lifting shafts is movable relative to the chuck base and includes an inclined platform. The inclined platform includes an inclined extension surface configured to support the wafer at the edge of the wafer and is configured to, when the wafer lifting shaft moves relative to the chuck base, cause the wafer to move to different height positions along the inclined extension surface. Thus, when only the edge of the wafer is in contact and the pattern member of the wafer is prevented from being physically contacted, the height of the wafer can be positioned accurately and stably to cause the wafer to smoothly switch between different height positions. When the mechanical structure of the wafer chuck is simplified, and the potential contamination factor caused by the structure such as the pins, the accuracy of the wafer process position and the wafer fetching and placing position is improved, and the wafer fetching and placing efficiency of the manipulator and the wafer cleaning efficiency can be improved.

BRIEF DESCRIPTION OF THE DRAWINGS

The drawings are provided to further understand the present disclosure form a part of the specification and are used to describe the present disclosure with the following embodiments of the present disclosure. However, the drawings do not limit the present disclosure.

DETAILED DESCRIPTION OF THE EMBODIMENTS

Figure 1:
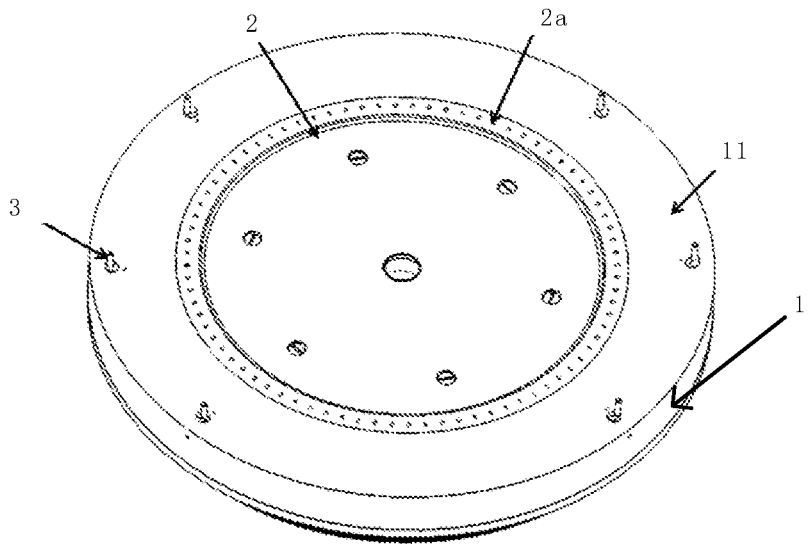
FIG. 1 illustrates a schematic structural diagram of a wafer chuck according to some embodiments of the present disclosure.

Specific embodiments of the present disclosure are described in detail in connection with the accompanying drawings. It should be understood that the specific embodiments described here are for describing and explaining the present disclosure and not for limiting the present disclosure.

To address the above technical problem, as one aspect of the present disclosure, a wafer chuck of semiconductor cleaning equipment is provided. As shown in FIG. 1 to FIG. 4, the wafer chuck includes a chuck base 1, a gas jet assembly 2 arranged at the chuck base 1, and a plurality of wafer lifting shafts 3 arranged at the chuck base 1. A top of the chuck base 1 includes a carrier surface 11 configured to carry the wafer. A gas outlet 2a of the gas jet assembly 2 is located in a center area of the carrier surface 11 and configured to jet gas between the carrier surface 11 and the wafer. The plurality of wafer lifting shafts 3 are distributed in a circumferential direction around the periphery of the gas outlet 2a of the gas jet assembly 2. Each wafer lifting shaft 3 is movable relative to the chuck base 1, and each wafer lifting shaft 3 is provided with an inclined platform 31. The inclined platform 31 includes an inclined extension surface 311. The inclined extension surface 311 is configured to carry the wafer at the edge and is configured to cause the wafer to move to different height positions along the inclined extension surface 311 when the wafer lifting shaft 3 is able to move relative to the chuck base 1.

In the process of the plurality of wafter lifting shafts 3 synchronously moving relative to the chuck base 1, the inclined extension surface 311 can move relative to the wafer. Since the inclined extension surface 311 has different heights at different positions in a path direction moving relative to the wafer. As the contact position between the edge of the wafer and the inclined extension surface 311 changes, the height position where the wafer is located can change too. That is, the wafer can move to different height positions along the inclined extension surface 311. Thus, when only the edge of the wafer is in contact, and physical contact with the pattern of the wafer is avoided, the height of the wafer can be precisely and stably positioned to cause the wafer to be smoothly switched between different height positions. Thus, the mechanical structure of the wafer chuck can be simplified, and the possible contamination factor caused by the structure such as pins can be eliminated. Meanwhile, the accuracy of the wafer processing position and the fetch and place positions of the wafer can be improved to further improve the wafer fetch and place efficiency and wafer cleaning efficiency.

Figure 2A:
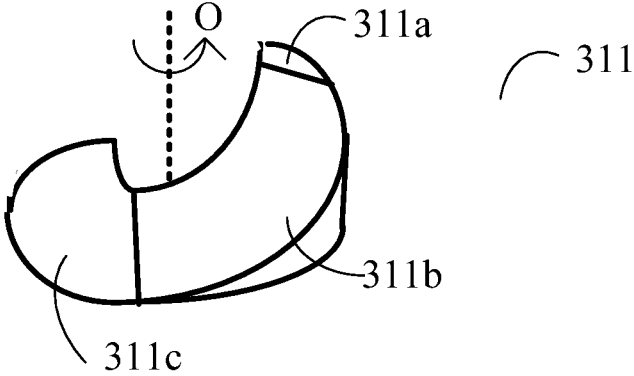
FIG. 2A illustrates a schematic structural diagram of an inclined extension surface according to embodiments of the present disclosure.

The inclined extension surface 311 above can have a plurality of shapes. For example, as shown in FIG. 2A, the inclined extension surface 311 includes a first surface 311a, a second surface 311c, and a transition curved surface 311b connecting between thereof. The first surface 311a is higher than the second surface 311c, and the second surface 311c is higher than the carrier surface 11. The transition curved surface 311b extends spirally around axis O of the wafer lifting shaft 3. Each wafer lifting shaft 3 can rotate relative to the chuck base 1 around axis O of the wafer lifting shaft 3 along the first direction or second direction that are opposite to each other. Thus, the wafer can slide to the first height position contacting the first surface 311a or the second height position contacting the second surface 311c.

In some embodiments, a plurality of shaft holes can be formed at the chuck base 1. The plurality of wafer lifting shafts 3 can pass through the plurality of shaft holes in a one-to-one correspondence.

It should be noted that, in the present disclosure, the height of the transition curved surface 311b can change smoothly around axis O of the wafer lifting shaft 3, and the heights at two ends of the transition curved surface 311b are flush with the heights of the first surface 311a and the second surface 311c. Thus, the first surface 311a, the second surface 311c, and the transition curved surface 311b can form a continuous extension surface, which ensures that the wafer can switch smoothly between the first height position and the second height position. It should be noted that, to ensure that the inclined extension surface 311 above only contacts the edge of the wafer, when the first surface 311a, the second surface 311c, and the transition curved surface 311b are further away from axis O along the radial direction of the wafter lighting shaft 3, the height can be lower. That is, the three surfaces can be also inclined in the radial direction of the wafer lifting shaft 3 to reduce the contact area with the wafer and only contact the edge of the wafer. Of course, the present disclosure is not limited to this. In some embodiments, as long as the contact member between the inclined extension surface 311 and the wafer is an ineffective area of the edge of the wafer, the pattern of the wafer cannot be affected.

Figure 5:
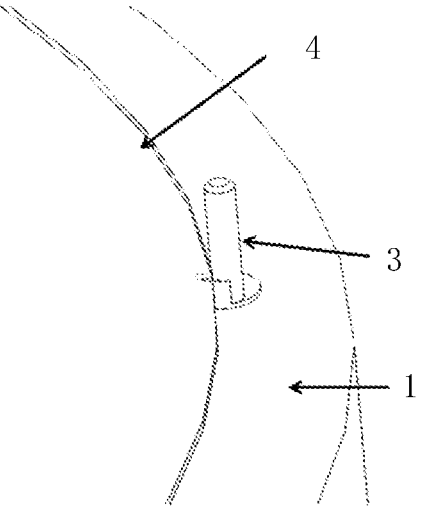
FIG. 5 illustrates a schematic diagram showing a wafer located on a first surface of a plurality of wafer lifting shafts according to embodiments of the present disclosure.
Figure 6:
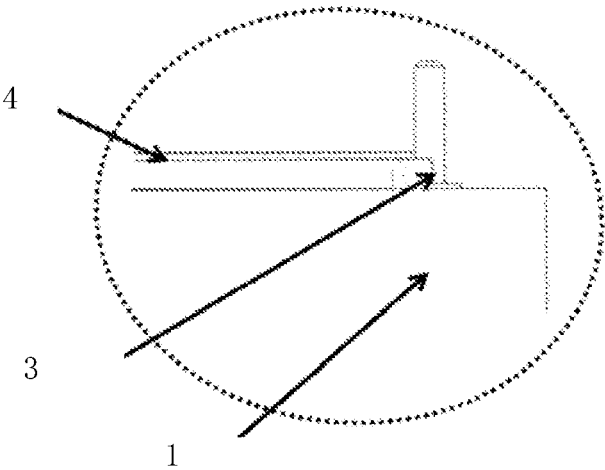
FIG. 6 illustrates a schematic diagram showing a position relationship between a wafer and a first surface and a second surface when the wafer is located on the first surface of the plurality of wafer lifting shafts according to embodiments of the present disclosure.
Figure 7:
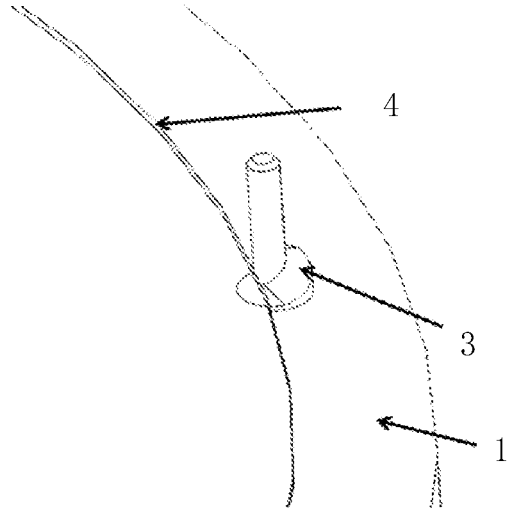
FIG. 7 illustrates a schematic diagram showing a wafer located on a second surface of a plurality of wafer lifting shafts according to embodiments of the present disclosure.
Figure 8:
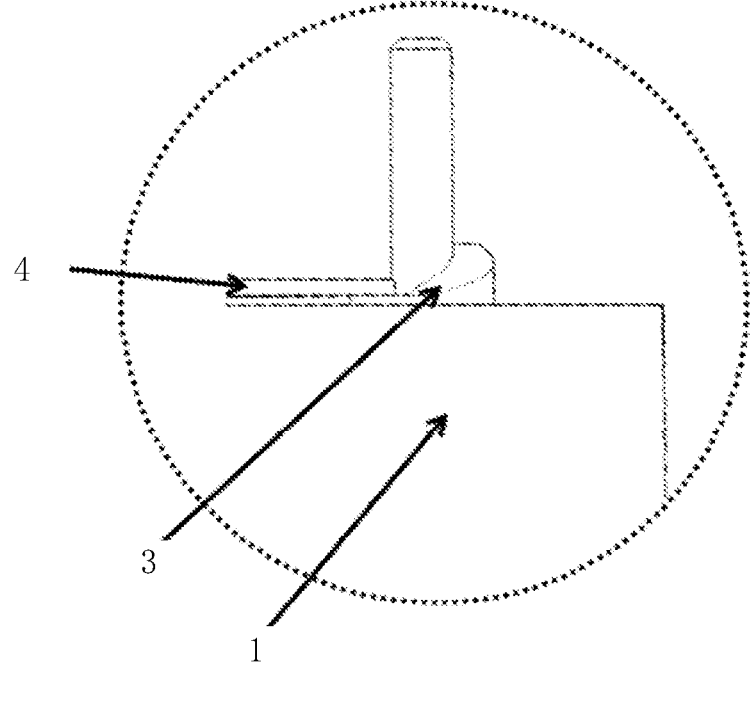
FIG. 8 illustrates a schematic diagram showing a position relationship between a wafer and a first surface and a second surface when the wafer is located on the second surface of the plurality of wafer lifting shafts according to embodiments of the present disclosure.

In some embodiments, as shown in FIG. 5 and FIG. 6, when the first surfaces 311a of the plurality of wafer lifting shafts 3 rotates to the position in which the first surfaces 311a can contact the edge of the wafer 4, sufficient space exists between the wafer 4 and the carrier surface 11. Thus, the wafer 4 can be placed on the first surfaces 311a of the plurality of wafer lifting shafts 3 by the manipulator, or the wafer 4 placed on the first surfaces 311a of the plurality of wafer lifting shafts 3 can be fetched by the manipulator. After the to-be-cleaned wafer 4 is placed on the first surface 311a, with the synchronous rotation with the plurality of wafer lifting shafts 3, the edge of the wafer can move along the transition curved surface 311b of each wafer lifting shaft 3 and move gradually downward with the guidance function of the rotating transition curved surface until onto the second surface 311c. Eventually, as shown in FIG. 7 and FIG. 8, the height of the wafer carried by the second surface 311c is lowered compared to the height when the wafer is carried by the first surface 311a for performing the wafer cleaning process.

Figure 10:
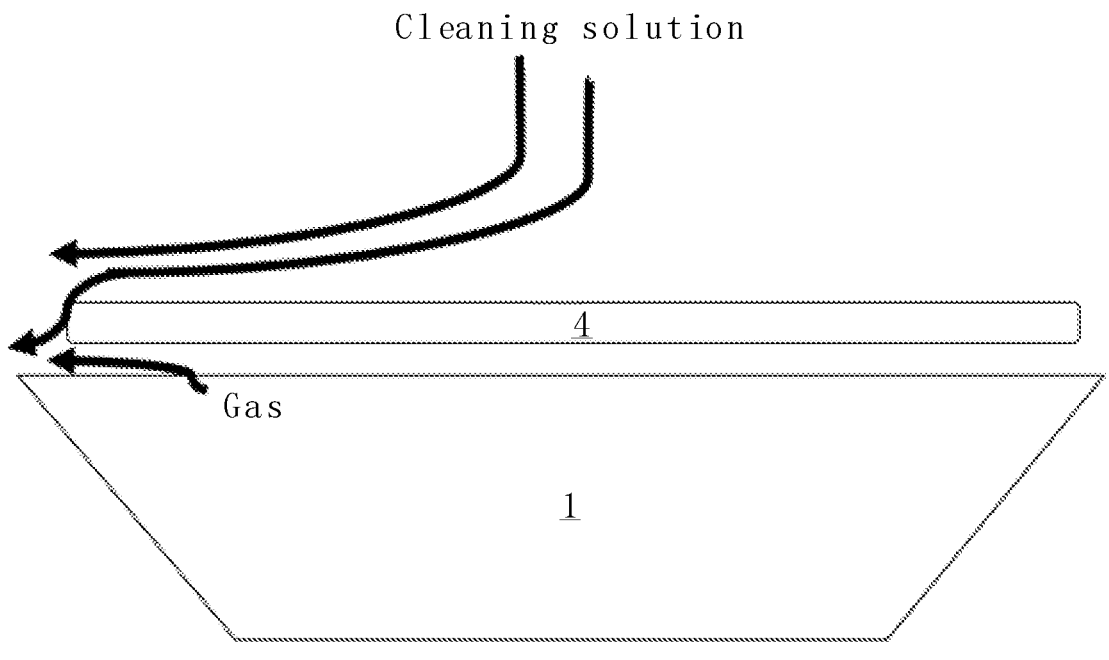
FIG. 10 illustrates a schematic diagram showing a flowing direction of a cleaning liquid and a gas flow when wafer equipment performs a wafer cleaning process according to embodiments of the present disclosure.

It should be noted that, in the wafer cleaning process, the purpose of the gas jet assembly 2 jetting the gas between the carrier surface 11 and the wafer 4 is to prevent cleaning liquid from splashing into the gap between the carrier surface 11 and the wafer 4 to corrode the backside of the wafer 4. The principle is shown in FIG. 10. The gas jetting function of the gas jetting assembly 2 can improve the stability of the wafer 4 placed on the second surface 311c.

In the wafer cleaning process, the gas sprayed by the gas jetting assembly 2 can flow in the direction of the arrow shown in FIG. 10 to form a gas protection layer in the gap between the carrier surface 11 and the wafer 4 to ensure that the cleaning liquid does not flow to the bottom surface of the wafer in the cleaning process to form the gas protection for the bottom surface of the wafer. Meanwhile, since the gas flow speed at the backside of the wafer is large, and the gas flow at the front side of the wafer is slow, according to the Bernoulli principle, the gas pressure on the backside of the wafer can be lower than the gas pressure on the front side of the wafer. Thus, a vertical downward pressure is applied on the wafer to firmly press the wafer on the second surface 311c cooperated with the weight of the wafer.

It should be noted that, in practical applications, the inclined extension surface 311 can also have any shape that allows the wafer to move to different height positions along the inclined extension surface 311. For example, the above inclined extension surface 311 can be a sloping surface that only contacts the edge of the wafer, and the height of the sloping surface gradually changes along a specified path. Thus, a plurality of wafer lifting shafts 3 can move synchronously along the specified path to cause the wafer to move to different height positions along the sloping surface. The above moving path can be an arc path or a straight-line path, e.g., a straight-line path extending radially along the carrier surface. In addition, the sloping surface can include a plurality sub-sloping surfaces with different heights and transition sloping surfaces connecting two neighboring sub-sloping surfaces. The plurality of sub-sloping surfaces and the transition sloping surfaces can form a continuous extension surface. The sub-sloping surfaces with different heights can carry the wafer at different height positions, and the transition sloping surfaces can ensure the wafer is smoothly switched between two different height positions. In addition, to reduce friction between the inclined extension surface 311 and the wafer, the inclined extension surface 311 can be smoothed or include an additional rolling structure to ensure the wafer can normally move relative to the inclined extension surface 311.

Figure 2B:
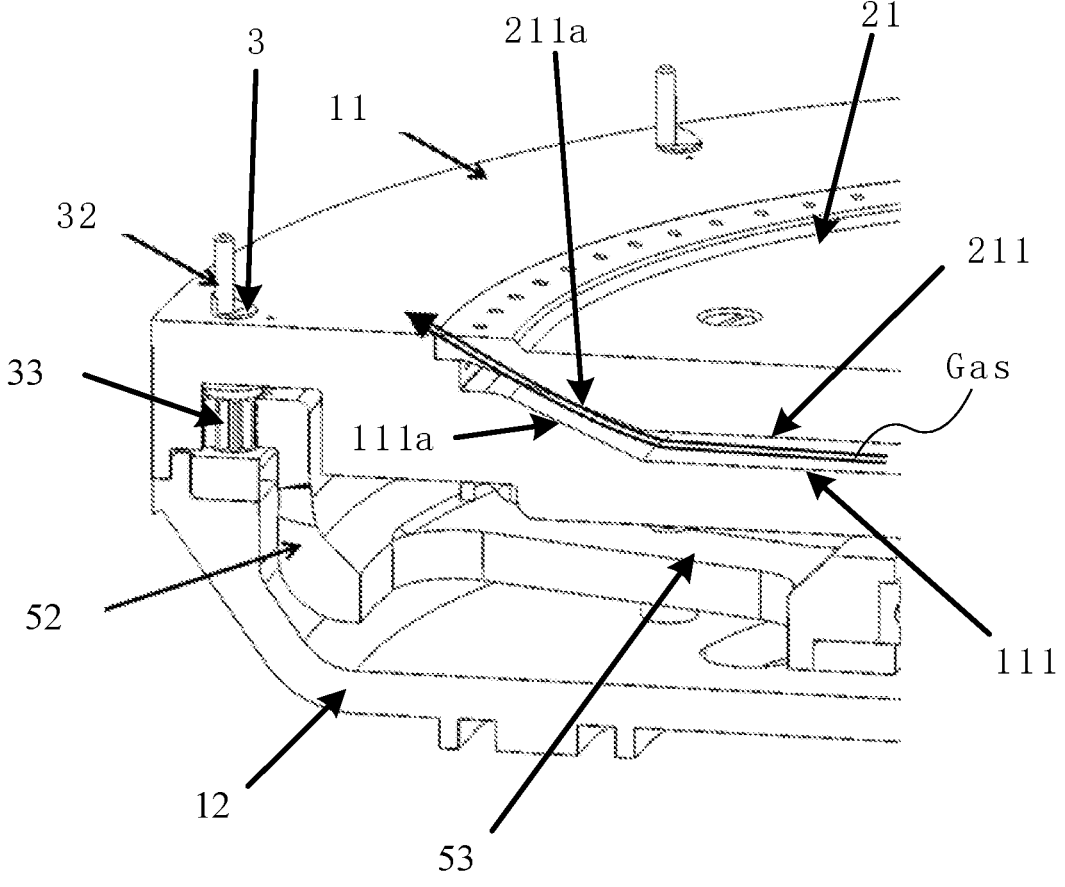
FIG. 2B illustrates a schematic cross-section diagram of a wafer chuck according to embodiments of the present disclosure.
Figure 3:
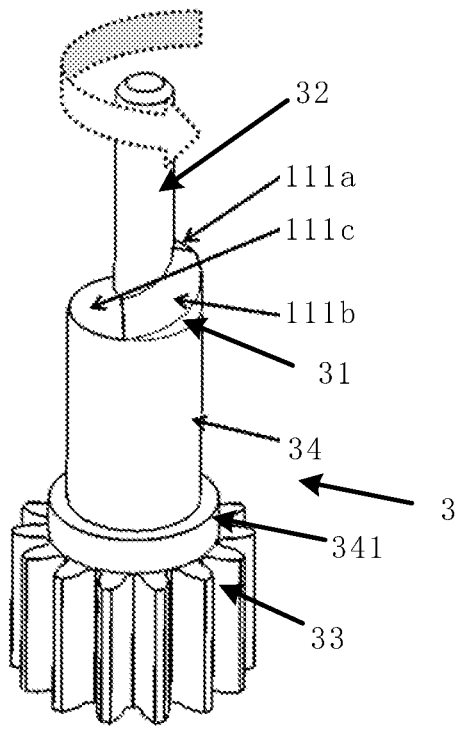
FIG. 3 illustrates a schematic diagram showing a principle of a wafer lifting shaft of a wafer chuck rotating to a first direction according to embodiments of the present disclosure.
Figure 4:
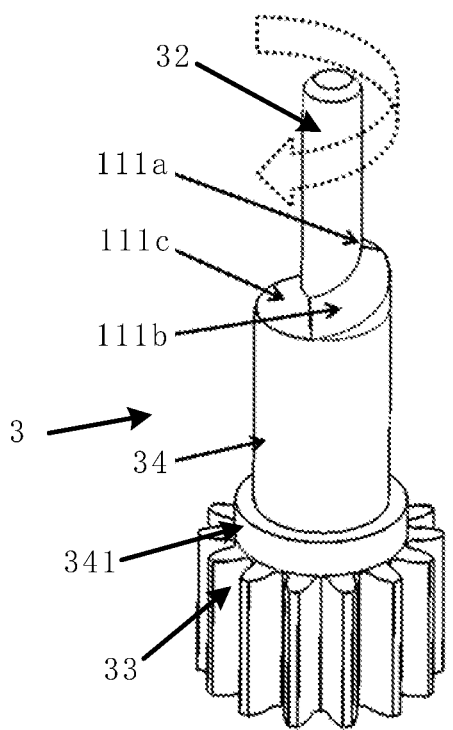
FIG. 4 illustrates a schematic diagram showing a principle of a wafer lifting shaft of a wafer chuck rotating to a second direction according to embodiments of the present disclosure.

To further improve the stability and accuracy of the wafer position, as a preferred embodiment of the present disclosure, as shown in FIG. 2B, FIG. 3, and FIG. 4, the top end of the wafer lifting shaft 3 is also provided with a fixed pillar 32 extending along a vertical direction. The inclined extension surface 311 extends around the fixed pillar 32 in the circumferential direction. Fixed pillars 32 of the plurality of wafer lifting shafts 3 can be configured to together limit the wafer within a position limiting space enclosed by the fixed pillars 32 of the plurality of wafer lifting shafts 3. That is, the axis of the fixed pillar 32 is located on another side of axis O of the wafter lifting shaft 3 relative to the transition curved surface 311b (i.e., the side corresponding to a step between the first surface 311a and the second surface 311c). With the plurality of fixed pillars 32, the position of the wafer can be limited to prevent the wafer from shifting when moving along the inclined extension surface 311.

In some embodiments, the axis of the fixed pillar 32 can be eccentrically arranged relative to axis O of the wafer lifting shaft 3 to adjust the size of the position limiting space when each wafer lifting shaft 3 rotates along the first direction or the second direction. Moreover, when the wafer contacts the first surface 311a or the second surface 311c, the fixed pillars 32 of the plurality of wafer lifting shafts 3 can be located at a position near and clamping the side edge of the wafer and can be configured to grip or release the wafer. In some embodiments, when the plurality of wafer lifting shafts 3 rotate synchronously, the wafer can descend from the first surface 311a to the second surface 311c via the transition curved surface 311b or ascend from the second surface 311c to the first surface 311a via the transition curved surface 311b. No matter whether the wafer is carried on the first surface 311a or the second surface 311c, the plurality of fixed pillars 32 can be positioned near and clamp the wafer. When the plurality of wafer lifting shafts 3 all rotate to a position where the transition curved surface 311b contacts the edge of the wafer, i.e., when the transition curved surface 311b faces the center of the wafer chuck, the size of the position limiting space enclosed by the plurality of fixed pillars 32 can be the largest. The plurality of fixed pillars 32 do not contact the side edge of the wafer. However, when the plurality of wafer lifting shafts 3 rotate to the position where the fixed pillars 32 face the center of the wafer chuck relative to the axes of the wafer lifting shafts 3, the size of the position limiting space enclosed by the plurality of fixed pillars 32 is not sufficient to accommodate the wafer, i.e., smaller than the diameter of the wafer. Thus, when the plurality of fixed pillars 32 rotate to the limit position where the wafer is gripped if the wafter lifting shafts 3 continue to rotate along the same direction, the plurality of fixed pillars 32 cannot continue to move when being blocked by the wafer side edge. Thus, the wafter lifting shafts 3 cannot continue to rotate in the same direction. Then, the rotation angle of the wafer lifting shafts 3 can be limited to maintain the first surface 311a or the second surface 311c at the position in contact with the wafer.

The plurality of fixed pillars 32 gripping the wafer can be effective in two phases, in one phase when the gas jetting assembly 2 starts to jet gas, the wafer can be carried by the first surface 311a. By rotating the wafer lifting shafts 3 until the plurality of fixed pillars 32 gripping the side edge of the wafer, the first surface 311a can be maintained to be at a position in contact with the wafer to fix the wafer at a first height position corresponding to the first surface 311a to prevent the wafer from moving due to the unstable flow field generated when the gas jetting assembly 2 starts to jet the gas to improve the stability of the wafer position. In another phase when the wafer is carried on the second surface 311c, the pressure difference (between the upper surface and the lower surface of the wafer) generated when the gas jetting assembly 2 jets the gas can press the wafer at the second surface 311c of the plurality of wafer lifting shaft 3, then, the wafter lifting shafts 3 are rotated until the plurality of fixed pillars 32 gripping the side edge of the wafer. Thus, the second surface 311c can be maintained to be at the position in contact with the wafer to fix the wafer at the second height position corresponding to the second surface 311c to further improve the stability of the wafer position.

In embodiments of the present disclosure, the rotation direction of the wafer lifting shafts is not limited. For example, as shown in FIG. 3 to FIG. 8, as an optional embodiment of the present disclosure, the wafer lifting shafts 3 can rotate clockwise (from a top view) to cause the second surface 311c, the transition curved surface 311b, and first surface 311a to sequentially face the wafer, i.e., cause the wafer to ascend (as shown in FIG. 4 to FIG. 6). The wafer lifting shafts 3 can rotate counterclockwise to cause the first surface 311a, the transition curved surface 311b, and the second surface 311c sequentially face the wafer, i.e., cause the wafer to descend (as shown in FIGS. 3, 7, and 8). Alternatively, in other embodiments of the present disclosure (not shown in the figures), the wafer lifting shafts can rotate clockwise (from a top view) to cause the first surface 311*a*, the transition curved surface 311*b*, and the second surface 311*c* to sequentially face the wafer, i.e., cause the wafer to descend. The wafer lifting shafts can also rotate counterclockwise to cause the second surface 311*c*, the transition curved surface 311*b*, and the first surface 311*a* to sequentially face the wafer, i.e., to ascend the wafer.

In some optional embodiments, to achieve automation control, the wafer chuck can also include a drive assembly configured to drive the plurality of wafer lifting shafts 3 to move synchronously. In embodiments of the present disclosure, how to control the plurality of wafer lifting shafts 3 to move synchronously is not limited. For example, a plurality of motors can drive the plurality of wafer lifting shafts to synchronously rotate according to a control signal, or a same belt can be frictionally connected to the plurality of wafer lifting shafts 3 to ensure synchronous rotation of the plurality of wafer lifting shafts.

To simplify the mechanical structure of the wafer chuck and improve the stability of the synchronous rotation of the plurality of wafer lifting shafts, as a preferred embodiment of the present disclosure, as shown in FIG. 2B to FIG. 4, the wafer lifting shaft 3 includes a gear segment 33 located below the carrier surface 11. The drive assembly includes a drive source 51 and a gear ring 52 coaxially arranged with the chuck base 1. The sidewall of the gear ring 52 includes a gear structure 521 arranged around the axis of the gear ring 52. The gear structure 521 can mesh with the gear segment 33. The drive source 51 can be configured to drive the gear ring 52 to rotate around the axis of the gear ring 52 to drive the plurality of wafer lifting shafts 3 to rotate synchronously.

In embodiments of the present disclosure, the drive assembly can include the drive source 51 and the gear ring 52. The synchronous rotation of the plurality of wafer lifting shafts 3 can be ensured through the simple gear structures and the combined transition of the gear structure (tooth structure) 521 of the gear ring 52 and the gear segment 33 of the wafer lifting shaft 3. It should be noted that in embodiment of the gear ring 52 driving the plurality of wafer lifting shafts 3 to synchronously rotate, the plurality of wafer lifting shafts 3 need to maintain the same rotation direction.

In embodiments of the present disclosure, how to prepare the gear segment of the wafer lifting shafts is not limited. For example, the tooth structure can be directly machined at the wafer lifting shaft 3 to obtain the gear segment 33.

To reduce maintenance costs for replacing an easily worn structure, as a preferred embodiment of the present disclosure the wafer lifting shaft 3 can be obtained by detachably assembling a shaft body and a gear structure. In some embodiments, as shown in FIG. 3 and FIG. 4, the wafer lifting shaft 3 includes a lifting shaft body 34 and a gear. The top end of the lifting shaft body 34 includes an inclined platform 31. The gear is coaxially sleeved on the lifting shaft body 34 to form a gear segment 33.

In embodiments of the present disclosure, the wafer lifting shaft 3 is assembled by the lifting shaft body 34 and the gear sleeved at the lifting shaft body 34. Thus, when the gear wears excessively, the lifting shaft body 34 can be kept, and only the gear can be replaced to reduce the maintenance cost for replacing the component. To further reduce the maintenance cost, in some embodiments, the gear can adopt a standard piece purchased in bulk from the market.

To facilitate the vertical positioning of the gear, as shown in FIG. 3 and FIG. 4, in some embodiments, the lifting shaft body 34 forms a positioning step 341.

In embodiments of the present disclosure, the position of the gear structure on the gear ring is not limited. For example, as an optional embodiment of the present disclosure, as shown in FIG. 2B, the gear structure 521 is formed on an outer side of the gear ring 52. That is, the gear segments 33 of the plurality of wafer lifting shafts 3 can be arranged around the outer side of the gear ring 52 and mesh with the outer tooths of the gear ring 52. In some other embodiments, the gear structure of the gear ring can be formed on the inner sidewall of the gear ring (i.e., formed into an inner gear). The gear ring can be sleeved at the outer side of the gear segments of the plurality of wafer lifting shafts and mesh with the gear segments of the plurality of wafer lifting shafts through the inner tooths.

In embodiments of the present disclosure, how the drive source is connected to the gear ring is not limited. For example, as an embodiment of the present disclosure, as shown in FIG. 2B, the drive source 51 can be a rotary motor with an output shaft coaxial with the wafer chuck. The output shaft of the drive source 51 is fixedly connected to the gear ring 52 through a connection flange 53.

In embodiments of the present disclosure, how to fix the axis of the wafer lifting shaft is not limited. For example, in some embodiments, as shown in FIG. 2B, the wafer chuck also includes a base 12 located under the chuck base 1. The base 12 is sealed and connected to the chuck base 1 to form a transmission chamber. The gear ring 52, the connection flange 53, and the gear segment 33 of the wafer lifting shaft 3 are all located within the transmission chamber. A plurality of mounting blind holes are formed at the bottom surface of the base 12, and the bottom end of the wafer lifting shaft 3 is arranged in a corresponding mounting blind hole on the base 12. To reduce the friction of the rotation of the wafer lifting shaft 3 in the mounting blind hole, in some embodiments, the bottom end of the wafer lifting shaft 3 is mounted in the mounting blind hole through the bearing.

In embodiments of the present disclosure, the structure of the gas jetting assembly is not limited. For example, in some embodiments, as shown in FIG. 1 and FIG. 2B, an installation groove is formed on the carrier surface 11. The bottom surface of the installation groove includes a first flat surface 111 and an inner conical surface 111*a* surrounding the first flat surface 111. The first flat surface 111 includes air guide holes (not shown in the figure) coaxially formed with the chuck base 1. The gas jetting assembly 2 includes a jetting cover 21. The jetting cover 21 is arranged in the installation groove. The bottom surface of the jetting cover 21 includes a second flat surface 211 and an outer conical surface 211*a* surrounding the second flat surface 211. A first gap is formed between the first flat surface 111 and the second flat surface 211, and a second gap is formed between the outer conical surface 211*a* and the inner conical surface 111*a*. The air guide holes, the first gap, and the second gap can communicate with each other.

A plurality of jetting holes can be formed at the edge of the jetting cover 21 passing through the top surface of the jetting cover 21 to the outer conical surface 211*a*. The plurality of jetting holes can be arranged at intervals in a circumferential direction of the jetting cover 21. Gas inlet ends of the plurality of jetting holes can communicate with the second gap. Gas outlet ends of the plurality of jetting holes can be gas outlet 2*a* of the gas jetting assembly. When the gas is jetted, the gas can be jetted out by the plurality of jetting holes (i.e., gas outlets 2*a*) through the gas guide holes, the first gap, and the second gap in sequence and can be blown to the backside of the wafer to form a gas protection layer.

To improve the stability of the gas flow on the backside of the wafer, in some embodiments, the jetting direction of the plurality of jetting holes can have a certain angle (for example, between 45° to 20°) with the carrier surface 11. As shown in FIG. 10, after the gas flow is jetted out, the gas is blown diagonally toward the backside of the wafer to form the gas protection layer.

In embodiments of the present disclosure, the gas composition jetted by the jetting assembly is not limited. For example, as an easily implementable embodiment of the present disclosure, the jetting assembly can be configured to jet nitrogen gas onto the backside of the wafer. In embodiments of the present disclosure, the gas flow rate and the pressure of the gas jetted by the jetting assembly are not limited. The gas flow rate and the pressure entering the conical chamber can be adjusted according to the requirements of the wafer cleaning process to achieve the desired backside suction force on the wafer.

In embodiments of the present disclosure, the number of wafer lifting shafts is not limited. For example, as an optional embodiment of the present disclosure, as shown in FIG. 1 and FIG. 2B, the wafer chuck includes 6 wafer lifting shafts 3. The 6 wafer lifting shafts 3 are evenly arranged at an interval around the axis of the chuck base 1.

As a second aspect of the present disclosure, wafer cleaning equipment is provided. The wafer cleaning equipment includes the wafer chuck of embodiments of the present disclosure.

In the wafer cleaning equipment of the present disclosure, by using the wafer chuck of embodiments of the present disclosure, the mechanical structure of the wafer chuck can be simplified. A potential contamination factor caused by the structure such as the pins can be eliminated, and the accuracy of the wafer processing position and the accuracy of the wafer fetch and place position can be improved to improve the wafer fetch and place efficiency of the manipulator and the wafer cleaning efficiency.

Figure 9:
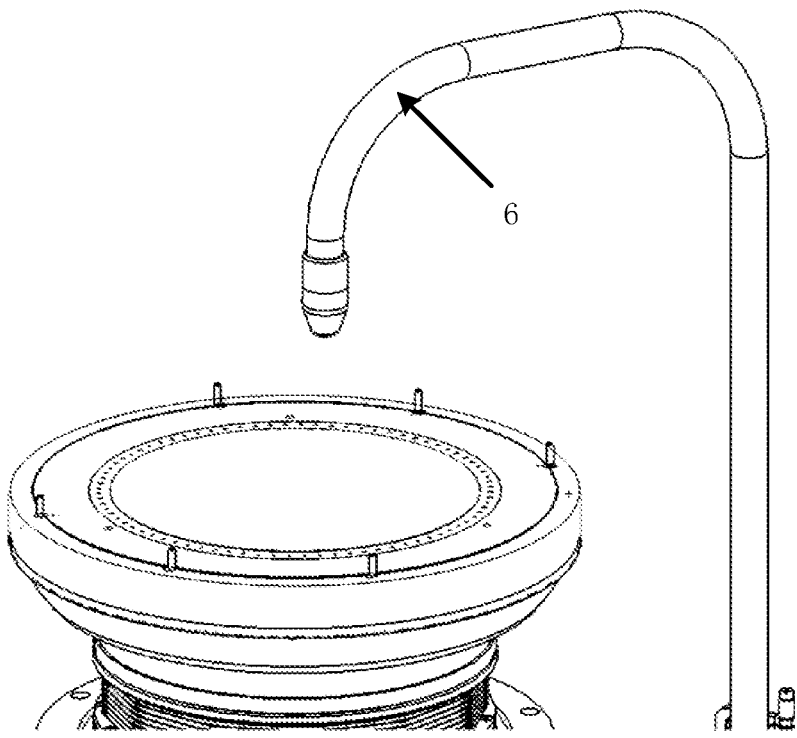
FIG. 9 illustrates a schematic structural diagram of wafer equipment according to embodiments of the present disclosure.

In embodiments of the present disclosure, other structures of the wafer cleaning equipment are not limited. For example, in some embodiments, as shown in FIG. 9, the wafer cleaning equipment also includes a spray assembly 6. The spray assembly 6 can be configured to spray cleaning solution to the wafer carried by the carrier surface from a position above the carrier surface.

As a third aspect of the present disclosure, a wafer cleaning method is provided. The wafer cleaning method can be applied to the wafer cleaning equipment of the present disclosure. The wafer cleaning method can include:

at S1, transferring a to-be-cleaned wafer onto the inclined extension surface to be located at a first height position of performing a wafer fetching and placing operation;
  at S2, controlling the plurality of wafer lifting shafts to move relative to the chuck base to cause the wafer to slide down along the inclined extension surface from the first height position to the second height position for the wafer cleaning process;
  at S3, controlling the jetting assembly to jet the gas and controlling the spray assembly to spray the cleaning solution onto the wafer for the wafer cleaning process; and
  at S4, controlling the jetting assembly to stop jetting the gas and controlling the spray assembly to stop spraying the cleaning solution to the wafer, and causing the plurality of wafer lifting shafts to move in a reverse direction to cause the wafer to slide up from the second height position along the inclined extension surface to the first height position to facilitate the transfer of the cleaned wafer.

It should be noted that steps S1 to S4 correspond to the cleaning process cycle of a single wafer. In the process of sequentially cleaning a plurality of wafers, steps S1 to S4 can be executed repeatedly for multiple times. In step S1, the first surfaces of the plurality of wafer lifting shafts facing the axis of the wafer chuck are the initial status of the wafer lifting shafts. In some embodiments of the present disclosure. The action after the jetting assembly stops jetting the gas in step 4 can be executed in step S1. That is, step S4 only includes controlling the gas jetting assembly to stop jetting the gas. In step S1, before receiving the to-be-cleaned wafer, the plurality of wafer lifting shafts can be driven to rotate until the first surfaces face the axis of the wafer chuck to cause the wafer located on the second surface to ascend and be transferred to the first surface to facilitate the transfer of the cleaned wafer (i.e., cause the plurality of wafer lifting shafts to be restored to the initial status).

In the wafer cleaning method of the present disclosure, when only the edge of the wafer is in contact, and the pattern member of the wafer is avoided in physical contact, the height of the wafer can be accurately and stably positioned to cause the wafer to smoothly switch between different height positions. Thus, when the mechanical structure of the wafer chuck is simplified, and the potential contamination factor caused by the structure such as pins is eliminated, the accuracy of the wafer process position and the accuracy of the wafer fetch and place position can be improved to further improve the wafer fetch and place efficiency of the manipulator and the wafer cleaning efficiency.

To further improve the stability and the accuracy of the wafer position, as an embodiment of the present disclosure, as shown in FIG. 2B, FIG. 3, and FIG. 4, the top end of the wafer lifting shaft also includes a fixed pillar extending along the vertical direction. The axis of the fixed pillar is located on the other side of the axis of the wafer lifting shaft relative to the transition curved surface. After the wafer is transferred to the first surface or the second surface, the plurality of fixed pillars can be near and clamp the wafer.

Based on the wafer chuck shown in FIGS. 1 to 4, when the wafer is at the first height position, the fixed pillars 32 of the plurality of wafer lifting shafts 3 are located at a position near and clamping the side edge of the wafer. When the wafer is at the second height position, the fixed pillars 32 of the plurality of wafer lifting shafts 3 can be located at the position near and clamping the side edge of the wafer. That is, whether the wafer is carried on the first surface 311a, or the second surface 311c, the plurality of fixed pillars 32 can be near and clamp the wafer.

When the plurality of wafer lifting shafts 3 are all rotated to the position where the transition curved surface 311b contacts the edge of the wafer, i.e., when the transition curved surface 311b faces the center of the wafer chuck, the size of the position limiting space enclosed by the plurality of fixed pillars 32 can be the largest. Then, the plurality of fixed pillars 32 do not contact the side edge of the wafer. When the plurality of wafer lifting shafts 3 are all rotated to the position when the fixed pillars 32 face the center of the wafer chuck relative to the axis of the wafer lifting shafts 3, the position limiting space enclosed by the plurality of fixed pillars 32 cannot accommodate the wafer, that is, smaller than the wafer diameter. Thus, when the plurality of fixed pillars 32 rotate to the limit position of clamping the side edge of the wafer if the wafer lifting shafts 3 continue to rotate along the same direction, the plurality of fixed pillars 32 can be blocked by the side edge of the wafer and cannot continue to rotate. Thus, the wafer lifting shafts 3 cannot continue to rotate along the same direction, and the rotation angle of the wafer lifting shafts 3 can be limited to maintain the first surface 311*a* or the second surface 311*c* to be at the position in contact with the wafer.

It can be understood that the above embodiments are only illustrative embodiments adopted to illustrate the principles of the present disclosure, and the present disclosure is not limited to this. For those skilled in the art, various modifications and improvements can be made without departing from the spirit and essence of the present disclosure, and these modifications and improvements are also within the scope of the present disclosure.

What is claimed is:

1. A wafer chuck in semiconductor cleaning equipment comprising:

a chuck base includes a carrier surface for supporting a wafer;

a jetting assembly arranged at the chuck base, a gas outlet of the jetting assembly being located in a center area of the carrier surface and being configured to jet gas between the carrier surface and the wafer; and a plurality of wafer lifting shafts arranged at the chuck base distributed around the gas outlet of the jetting assembly along a circumferential direction of the carrier surface, each wafer lifting shaft of the plurality of wafer lifting shafts being movable relative to the chuck base and including an inclined platform, and each inclined platform including an inclined extension surface configured to support the wafer at an edge of the wafer and cause the wafer to move along the inclined extension surface to different height positions when the corresponding wafer lifting shaft moves relative to the chuck base.

2. The wafer chuck according to claim 1, wherein:

each inclined extension surface includes a first surface, a second surface, and a transition curved surface connecting between thereof, the first surface being higher than the second surface, and the second surface being higher than the carrier surface, and the transition curved surface spirally extending around an axis of the corresponding wafer lifting shaft; and each of the plurality of wafer lifting shafts rotates relative to the chuck base around the axis of the respective wafer lifting shaft in a first direction or a second direction opposite to the first direction to cause the wafer to slide to a first height position in contact with the first surface along the transition curved surface or a second height position in contact with the second surface.

3. The wafer chuck according to claim 2, wherein:

a top end of each of the plurality of wafer lifting shafts further includes a fixed pillar extending in a vertical direction;

each inclined extension surface extends around a circumference of the corresponding fixed pillar; and fixed pillars of the plurality of wafer lifting shafts are configured to together limit the wafer within a position limiting space enclosed by the fixed pillars of the plurality of wafer lifting shafts.

4. The wafer chuck according to claim 3, wherein:

an axis of each fixed pillar is eccentrically arranged relative to the axis of the corresponding wafer lifting shaft to adjust a size of the position limiting space when the respective wafer lifting shaft rotates in the first direction or the second direction; and when the wafer is in contact with the first surface or the second surface, the fixed pillars of the plurality of wafer lifting shafts are located at a position close to and clamping a side edge of the wafer.

5. The wafer chuck according to claim 2, wherein the wafer chuck further includes a drive assembly configured to drive the plurality of wafer lifting shafts to rotate synchronously.

6. The wafer chuck according to claim 5, wherein:

each of the plurality of wafer lifting shafts includes a gear segment under the carrier surface;

the drive assembly includes a drive source and a gear ring coaxially arranged with the chuck base;

a gear structure around an axis of the gear ring is arranged at a sidewall of the gear ring;

the gear structure meshes with each gear segment; and the drive source is configured to drive the gear ring to rotate around the axis of the gear ring to drive the plurality of wafer lifting shafts to rotate synchronously.

7. The wafer chuck according to claim 6, wherein each of the plurality of wafer lifting shafts includes:

a lifting shaft body, a top end of the lifting shaft body including the corresponding inclined platform; and a gear sleeved at the lifting shaft body to form the corresponding gear segment.

8. The wafer chuck according to claim 1, wherein:

the carrier surface includes an installation groove, a bottom surface of the installation groove including a first flat surface and an inner conical surface around the first flat surface, and a gas guide hole coaxial with the chuck base being formed on the first flat surface;

the jetting assembly includes a jet cover arranged in the installation groove, a bottom surface of the jet cover including a second flat surface and an outer conical surface around the second flat surface, a first gap being formed between the first flat surface and the second flat surface, a second gap being formed between the outer conical surface and the inner conical surface, and the gas guide hole, the first gap, and the second gap communicating with each other; and a plurality of jetting holes penetrating from a top surface of the jet cover to the outer conical surface are formed at an edge of the jet cover and arranged at intervals along a circumferential direction of the jet cover, a gas inlet end of each of the plurality of jetting holes communicating with the second gap, and a gas outlet end of each of the plurality of jetting holes being the gas outlet of the jetting assembly.

9. Wafer cleaning equipment comprising a wafer chuck including:

a chuck base includes a carrier surface for supporting a wafer;

a jetting assembly arranged at the chuck base, a gas outlet of the jetting assembly being located in a center area of the carrier surface and being configured to jet gas between the carrier surface and the wafer; and a plurality of wafer lifting shafts arranged at the chuck base distributed around the gas outlet of the jetting assembly along a circumferential direction of the carrier surface, each wafer lifting shaft of the plurality of wafer lifting shafts being movable relative to the chuck base and including an inclined platform, and each inclined platform including an inclined extension surface configured to support the wafer at an edge of the wafer and cause the wafer to move along the inclined extension surface to different height positions when the corresponding wafer lifting shaft moves relative to the chuck base.

10. The wafer cleaning equipment according to claim 9, further comprising:

a spray assembly configured to spray cleaning solution onto the wafer carried by the carrier surface from a position above the carrier surface.

11. The wafer cleaning equipment according to claim 9, wherein:

each inclined extension surface includes a first surface, a second surface, and a transition curved surface connecting between thereof, the first surface being higher than the second surface, and the second surface being higher than the carrier surface, and the transition curved surface spirally extending around an axis of the corresponding wafer lifting shaft; and each of the plurality of wafer lifting shafts rotates relative to the chuck base around the axis of the respective wafer lifting shaft in a first direction or a second direction opposite to the first direction to cause the wafer to slide to a first height position in contact with the first surface along the transition curved surface or a second height position in contact with the second surface.

12. The wafer cleaning equipment according to claim 11, wherein:

a top end of each of the plurality of wafer lifting shafts further includes a fixed pillar extending in a vertical direction;

each inclined extension surface extends around a circumference of the corresponding fixed pillar; and fixed pillars of the plurality of wafer lifting shafts are configured to together limit the wafer within a position limiting space enclosed by the fixed pillars of the plurality of wafer lifting shafts.

13. The wafer cleaning equipment according to claim 12, wherein:

an axis of each fixed pillar is eccentrically arranged relative to the axis of the corresponding wafer lifting shaft to adjust a size of the position limiting space when the respective wafer lifting shaft rotates in the first direction or the second direction; and when the wafer is in contact with the first surface or the second surface, the fixed pillars of the plurality of wafer lifting shafts are located at a position contacting and clamping a side edge of the wafer.

14. The wafer cleaning equipment according to claim 11, wherein the wafer chuck further includes a drive assembly configured to drive the plurality of wafer lifting shafts to rotate synchronously.

15. The wafer cleaning equipment according to claim 14, wherein:

each of the plurality of wafer lifting shafts includes a gear segment under the carrier surface;

the drive assembly includes a drive source and a gear ring coaxially arranged with the chuck base;

a gear structure around an axis of the gear ring is arranged at a sidewall of the gear ring;

the gear structure meshes with each gear segment; and the drive source is configured to drive the gear ring to rotate around the axis of the gear ring to drive the plurality of wafer lifting shafts to rotate synchronously.

16. The wafer cleaning equipment according to claim 15, wherein each of the plurality of wafer lifting shafts includes:

a lifting shaft body, a top end of the lifting shaft body including the corresponding inclined platform; and a gear sleeved at the lifting shaft body to form the corresponding gear segment.

17. The wafer cleaning equipment according to claim 9, wherein:

the carrier surface includes an installation groove, a bottom surface of the installation groove including a first flat surface and an inner conical surface around the first flat surface, and a gas guide hole coaxial with the chuck base being formed on the first flat surface;

the jetting assembly includes a jet cover arranged in the installation groove, a bottom surface of the jet cover including a second flat surface and an outer conical surface around the second flat surface, a first gap being formed between the first flat surface and the second flat surface, a second gap being formed between the outer conical surface and the inner conical surface, and the gas guide hole, the first gap, and the second gap communicating with each other; and a plurality of jetting holes penetrating from a top surface of the jet cover to the outer conical surface are formed at an edge of the jet cover and arranged at intervals along a circumferential direction of the jet cover, a gas inlet end of each of the plurality of jetting holes communicating with the second gap, and a gas outlet end of each of the plurality of jetting holes being the gas outlet of the jetting assembly.

18. A wafer cleaning method applied to wafer cleaning equipment comprising:

transferring a to-be-cleaned wafer onto an inclined extension surface to be located at a first height position of performing a wafer fetching and placing operation;

controlling a plurality of wafer lifting shafts to move relative to a chuck base to cause the wafer to slide down from the first height position along the inclined extension surface to a second height position for a wafer cleaning process;

controlling a jetting assembly to jet gas and controlling a spray assembly to spray cleaning solution onto the wafer for the wafer cleaning process; and controlling the jetting assembly to stop jetting the gas, controlling the spray assembly to stop spraying the cleaning solution onto the wafer, and controlling the plurality of wafer lifting shafts to move reversely to cause the wafer to slide up from the second height position along the inclined extension surface to the first height position.

19. The wafer cleaning method according to claim 18, wherein:

the chuck base includes a carrier surface for supporting the wafer;

the inclined extension surface includes a first surface, a second surface, and a transition curved surface connecting between thereof, the first surface being higher than the second surface, the second surface being higher than the carrier surface, and the transition curved surface spirally extending around an axis of a wafer lifting shaft of the plurality of wafer lifting shafts;

each of the plurality of wafer lifting shafts rotates relative to the chuck base and around the axis of the respective wafer lifting shaft in a first direction or a second direction that is opposite to the first direction to cause the wafer to slide to the first height position in contact with the first surface or the second height position in contact with the second surface along the transition curved surface;

a top end of each of the plurality of wafer lifting shafts includes a fixed pillar extending in a vertical direction, each inclined extension surface extends around a circumferential direction of the corresponding fixed pillar, and fixed pillars of the plurality of wafer lifting shafts are configured to together limit the wafer in a position limiting space enclosed by the fixed pillars;

an axis of each fixed pillar is arranged eccentrically relative to the axis of the corresponding wafer lifting shaft to adjust a size of the position limiting space when the plurality of wafer lifting shafts rotate in the first direction or the second direction; and when the wafer contacts the first surface or the second surface, the fixed pillars of the plurality of wafer lifting shafts are at a position contacting and clamping a side edge of the wafer;

when the wafer is at the first height position, the fixed pillars of the plurality of wafer lifting shafts are at the position contacting and clamping the side edge of the wafer; and when the wafer is at the second height position, the fixed pillars of the plurality of wafer lifting shafts are at the position contacting and clamping the side edge of the wafer.

20. The wafer cleaning method according to claim 19, wherein the wafer chuck further includes a drive assembly configured to drive the plurality of wafer lifting shafts to rotate synchronously.

* * * * *